US012684842B2

(12) United States Patent
Lee

(10) Patent No.: US 12,684,842 B2
(45) Date of Patent: Jul. 14, 2026

(54) POWER SEMICONDUCTOR DEVICE AND METHOD FOR FABRICATING THE SAME

(71) Applicants: HYUNDAI MOTOR COMPANY, Seoul (KR); KIA CORPORATION, Seoul (KR)

(72) Inventor: Jong Seok Lee, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 647 days.

(21) Appl. No.: 18/077,760

(22) Filed: Dec. 8, 2022

(65) Prior Publication Data

US 2024/0047530 A1 Feb. 8, 2024

(30) Foreign Application Priority Data

Aug. 3, 2022 (KR) ........................ 10-2022-0096880

(51) Int. Cl.
*H10D 62/17* (2025.01)
*H10D 30/01* (2025.01)
(Continued)

(52) U.S. Cl.
CPC ....... *H10D 62/307* (2025.01); *H10D 30/0291* (2025.01); *H10D 62/153* (2025.01); *H10D 62/393* (2025.01); *H10D 84/146* (2025.01)

(58) Field of Classification Search
CPC ............. H10D 62/307; H10D 30/0291; H10D 62/153; H10D 62/393; H10D 84/146;
(Continued)

(56) References Cited

U.S. PATENT DOCUMENTS

| 6,852,597 B2 | 2/2005 | Park et al. |
| 7,951,676 B2 | 5/2011 | Schmidt |
| | (Continued) | |

FOREIGN PATENT DOCUMENTS

| CN | 113035955 A | 6/2021 |
| JP | 5472862 B2 | 2/2014 |
| | (Continued) | |

OTHER PUBLICATIONS

Non-Final Office Action mailed Sep. 10, 2024 cited in corresponding U.S. Appl. No. 17/707,706; 12 pp.
(Continued)

*Primary Examiner* — Mohammad A Rahman
(74) *Attorney, Agent, or Firm* — Lempia Summerfield Katz LLC

(57) ABSTRACT

A power semiconductor device includes a semiconductor layer, a well region located inside the semiconductor layer and having a first conductivity type, a source region located on the well region and having a second conductivity type, a gate region in contact with a side surface of the well region and surrounding the well region, a drift region in contact with bottom surfaces of the well region and the gate region and having the second conductivity type, and a contact region located on the well region and having the first conductivity type. The drift region includes a protruding region in contact with another side surface of the well region. The power semiconductor device includes a source electrode in contact with each of the source region, the contact region, and the protruding region.

8 Claims, 15 Drawing Sheets

(51) Int. Cl.
  H10D 62/13          (2025.01)
  H10D 84/00          (2025.01)
(58) Field of Classification Search
  CPC .. H10D 30/668; H10D 62/107; H10D 62/127;
              H10D 62/8325; H10D 64/519
  See application file for complete search history.

(56)                    References Cited

U.S. PATENT DOCUMENTS

|  |  |  |
|---|---|---|
| 8,124,533 B2 | 2/2012 | Narazaki |
| 9,373,692 B2 | 6/2016 | Hirler et al. |
| 9,859,400 B2 | 1/2018 | Darwish et al. |
| 10,480,327 B2 | 11/2019 | Rathay |
| 12,131,906 B2 | 10/2024 | Hino et al. |
| 2003/0068864 A1 | 4/2003 | Il-Yong et al. |
| 2010/0240183 A1 | 9/2010 | Narazaki |
| 2018/0114845 A1 | 4/2018 | Mimura et al. |
| 2018/0308938 A1 | 10/2018 | Siemieniec et al. |
| 2019/0109218 A1 | 4/2019 | Corvasce |
| 2019/0181229 A1 | 6/2019 | Okumura |
| 2022/0406937 A1 | 12/2022 | Karner |

| | | | |
|---|---|---|---|
| 2023/0019288 A1* | 1/2023 | Baringhaus | .......... H10D 64/252 |
| 2023/0036221 A1* | 2/2023 | Hino | ....................... H02M 1/08 |
| 2023/0061126 A1 | 3/2023 | Lee et al. | |

FOREIGN PATENT DOCUMENTS

| | | |
|---|---|---|
| JP | 6947338 B1 | 10/2021 |
| KR | 100400079 B1 | 9/2003 |
| KR | 100555444 B1 | 3/2006 |
| KR | 20180087535 A | 8/2018 |
| KR | 20230032334 A | 3/2023 |

OTHER PUBLICATIONS

Dong-Hyeon Kim et al., Effect of P-Emitter Length and Structure on Asymmetric SiC MOSFET Performance, J. Korean Inst. Electr. Electron. Mater. Eng.; Mar. 2020; 5 pp.
Notice of Allowance cited in Korean application No. 10-2021-0115073; Nov. 14, 2025; 4 pp.
Office action cited in Korean application No. 10-2022-0096880; Jan. 10, 2026; 10 pp.

* cited by examiner

POWER SEMICONDUCTOR DEVICE AND METHOD FOR FABRICATING THE SAME

CROSS-REFERENCE TO RELATED APPLICATION

This application claims the benefit of and priority to Korean Patent Application No. 10-2022-0096880, filed in the Korean Intellectual Property Office on Aug. 3, 2022, the entire contents of which are incorporated herein by reference.

TECHNICAL FIELD

The present disclosure relates to a power semiconductor.

BACKGROUND

The statements in this section merely provide background information related to the present disclosure and may not constitute prior art.

A power semiconductor, as a semiconductor device that controls high voltage and high current, may serve as an electrical switch. A power semiconductor device may have a high resistance against heat and stress for processing of the high voltage and the high current. In addition, to operate as the switch, power consumption may be low, and a breakdown voltage, which is a maximum voltage capable of maintaining an OFF state of the switch, may be high.

A power MOS field effect transistor (MOSFET), as a type of the power semiconductor, may have characteristics such as power saving, high efficiency, miniaturization, high reliability, high-speed switching, and low noise.

SUMMARY

An aspect of the present disclosure provides a power semiconductor device and a method for fabricating the same capable of increasing a channel density and reducing a power loss while alleviating electric field concentration at a lower portion of a gate region.

In addition, another aspect of the present disclosure allows the power semiconductor device to have a Schottky barrier diode embedded therein and thus reduce a power loss of the device during reverse conduction and preventing deterioration of the device.

The technical problems to be solved by the present disclosure are not limited to the aforementioned problems, and any other technical problems not mentioned herein should be clearly understood from the following description by those having ordinary skill in the art to which the present disclosure pertains.

According to an aspect of the present disclosure, a power semiconductor device includes a semiconductor layer; a well region located inside the semiconductor layer and having a first conductivity type; a source region located on the well region and having a second conductivity type; a gate region in contact with a side surface of the well region and surrounding the well region; a drift region in contact with bottom surfaces of the well region and the gate region and having the second conductivity type; and a contact region located on the well region and having the first conductivity type. The drift region includes a protruding region in contact with another side surface of the well region. The power semiconductor device includes a source electrode in contact with each of the source region, the contact region, and the protruding region.

In one implementation, the power semiconductor device may further include a first channel region and a second channel region located in a region where the gate region and the well region are in contact with each other. The first channel region may include a horizontal channel extending from the source region toward the protruding region. The second channel region may include a vertical channel extending from the source region along a side surface of the gate region.

In one implementation, a Schottky barrier diode may be formed between the source electrode and the protruding region.

In one implementation, a doping concentration of the source region may be higher than a doping concentration of the drift region.

In one implementation, a doping concentration of the contact region may be higher than a doping concentration of the well region.

In one implementation, the power semiconductor device may further include a substrate region located beneath the drift region and having the second conductivity type. The power semiconductor device may further include a drain electrode located beneath the substrate region and in contact with the substrate region. A doping concentration of the substrate region may be higher than a doping concentration of the drift region.

In one implementation, the gate region may be in contact with the well region on at least three surfaces.

In one implementation, the well region may be located at a first depth from one surface of the semiconductor layer. The gate region may be located at a second depth from the one surface of the semiconductor layer. The first depth may be greater than the second depth. The well region may include an extended region extending along the bottom surface of the gate region.

In one implementation, the power semiconductor device may further include a second channel region located in a region where the gate region and the well region are in contact with each other. The second channel region may include a vertical channel extending from the source region along a side surface of the gate region and an extended channel positioned on the extended region and extending along the bottom surface of the gate region.

According to another aspect of the present disclosure, a method for fabricating a power semiconductor device includes forming a drift region having a second conductivity type in a semiconductor layer. The method also includes forming a well region located at a first depth from one surface of the semiconductor layer and having a first conductivity type. The method also includes forming a protruding region in contact with the well region. The method also includes forming a source region having the second conductivity type on the well region, forming a contact region having the first conductivity type on the well region. The method also includes forming the semiconductor layer and the well region to be recessed by a second depth. The method also includes forming a gate region in contact with a side surface of the well region and surrounding the well region. The method also includes forming a source electrode in contact with each of the source region, the contact region, and the protruding region.

In one implementation, a Schottky barrier diode may be formed between the source electrode and the protruding region.

In one implementation, the first depth may be greater than the second depth.

In one implementation, the gate region may be in contact with the well region on at least three surfaces.

In one implementation, a doping concentration of the contact region may be higher than a doping concentration of the well region.

In one implementation, a doping concentration of the source region may be higher than a doping concentration of the drift region.

In one implementation, a first channel region and a second channel region may be formed in a region where the gate region and the well region are in contact with each other. The first channel region may include a horizontal channel extending from the source region toward the protruding region. The second channel region may include a vertical channel extending from the source region along a side surface of the gate region.

In one implementation, the forming of the gate region may include forming the well region to be recessed by the second depth such that the well region includes an extended region extending along a bottom surface of the gate region.

In one implementation, the second channel region may include an extended channel extending along the bottom surface of the gate region.

BRIEF DESCRIPTION OF THE DRAWINGS

The above and other objects, features, and advantages of the present disclosure should be more apparent from the following detailed description taken in conjunction with the accompanying drawings.

DETAILED DESCRIPTION

Figure 1:
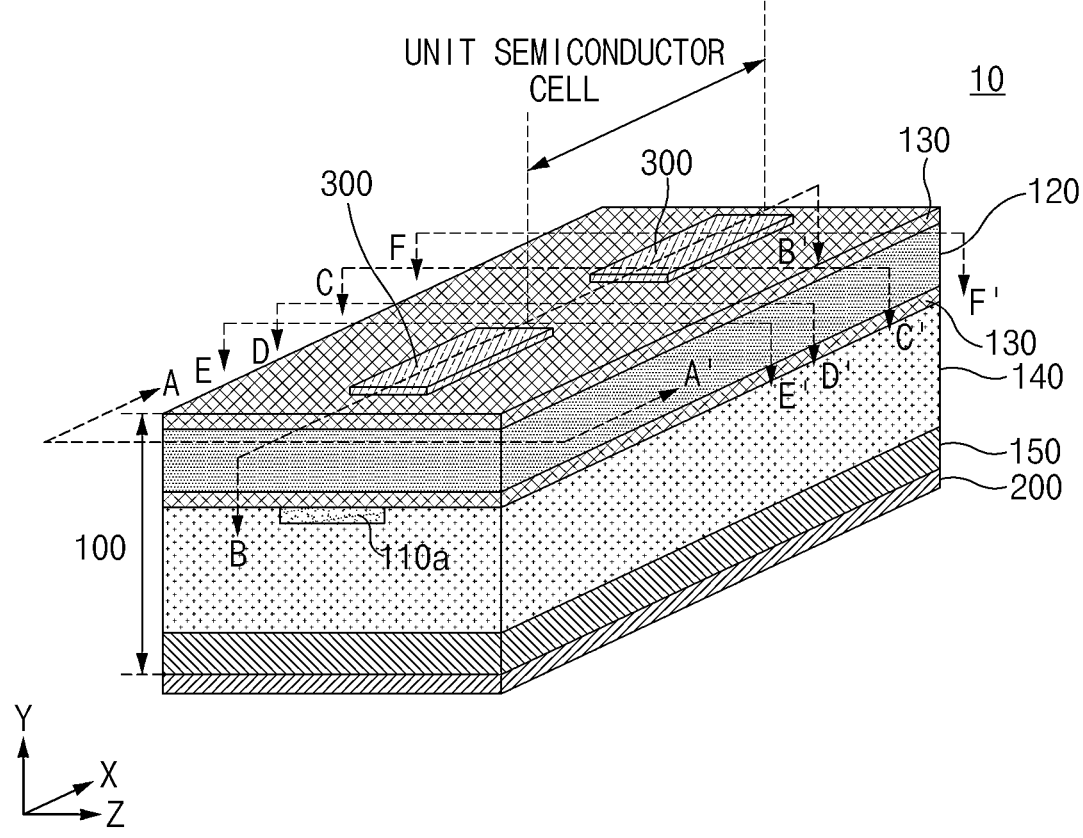
FIG. 1 is a schematic perspective view showing a power semiconductor device according to an embodiment of the present disclosure.

Hereinafter, various embodiments are described with reference to the accompanying drawings. However, it should be understood that the present disclosure is not limited to a particular embodiment but includes various modifications, equivalents, and/or alternatives of the embodiment. Embodiment of the present disclosure may provide various effects that may be directly or indirectly recognized through the present disclosure.

A following embodiment is provided to make disclosure of the present disclosure complete and to fully inform those of ordinary skill in the art of a scope of the present disclosure. In addition, for convenience of illustration, sizes of at least some of components may be exaggerated or reduced in the drawings. Like reference numerals in the drawings refer to like elements.

Unless defined otherwise, all terms used herein have the same meaning as commonly understood by those of ordinary skill in the art. In the drawings, sizes of a layer and a region are exaggerated for illustration and thus are provided to illustrate general structures of the present disclosure.

When a component, device, element, or the like of the present disclosure is described as having a purpose or performing an operation, function, or the like, the component, device, or element should be considered herein as being "configured to" meet that purpose or to perform that operation or function.

FIG. 1 is a schematic perspective view showing a power semiconductor device 10 according to an embodiment of the present disclosure.

Referring to FIG. 1, the power semiconductor device 10 may have a power MOSFET structure including a semiconductor layer 100, a drain electrode 200, and a source electrode 300. A gate electrode may be formed inside the semiconductor layer 100, and a gate region 120 and other regions (e.g., a drift region 140) may be electrically separated from each other by an insulating layer 130.

The semiconductor layer 100 may refer to one or a plurality of semiconductor material layers. For example, the semiconductor layer 100 may include a doped silicon carbide (SiC) substrate layer or an epitaxial layer, and the substrate layer or the epitaxial layer may be formed in a multi-layer structure.

A silicon carbide (SiC) may have a wider band gap than a silicon. Therefore, the silicon carbide may maintain stability even at a high temperature compared to the silicon. Furthermore, the silicon carbide may have a dielectric breakdown field strength that is very high compared to that of the silicon and thus may operate stably even at a high voltage. Accordingly, the power semiconductor device 10 using the silicon carbide as the semiconductor layer 100 may have a higher breakdown voltage and an excellent heat dissipation characteristic compared to those of the case using the silicon and may exhibit a stable operation characteristic even at the high temperature.

The drain electrode 200 may be formed beneath the semiconductor layer 100. The source electrode 300 may be formed on the semiconductor layer 100. The drain electrode 200 and the source electrode 300 may include a conductor, and the conductor may include, for example, polysilicon or metal.

The plurality of source electrodes 300 may be repeatedly formed for each unit semiconductor cell, and the plurality of source electrodes 300 may be connected to each other by a metal layer (not shown).

The plurality of unit semiconductor cells may be repeatedly arranged in an X-axis direction, and a set of the unit semiconductor cells may be the power semiconductor device 10.

The semiconductor layer 100 may include an extended region 110a, the gate region 120, the insulating layer 130, the drift region 140, a substrate region 150, and the like. The extended region 110*a* may be a portion of a well region included in the semiconductor layer 100. A structure of the well region will be described in detail with reference to FIG. 2.

The extended region 110*a* may be doped with an impurity of a first conductivity type. The first conductivity type may be a conductivity type different from that of the drift region 140. For example, the extended region 110*a* may be a region doped with a P-type impurity.

The well region and the extended region 110*a* included in the well region may be located in a region recessed by a first depth inside the semiconductor layer 100 from one surface of the semiconductor layer 100.

The extended region 110*a* may be a region extending from the well region along a bottom surface of the gate region 120. Shapes of channel regions formed inside the semiconductor layer 100 may vary based on shapes of the well region and the extended region 110*a*. The shapes of the channel regions are described in detail with reference to FIGS. 4A, 4B, and 4C.

The gate region 120 may be recessed by a second depth inside the semiconductor layer 100 and may be formed to surround the well region.

The gate region 120 may include the conductor such as the metal or the silicon. The channel regions may be formed inside the semiconductor layer 100 by an operating voltage applied to the gate region 120. According to one embodiment, the channel regions may be formed in the well region and the extended region 110*a*. Specifically, the channel regions may be formed in a region where the well region and the gate region 120 are in contact with each other.

The insulating layer 130 may electrically isolate the gate region 120 from another adjacent region (e.g., a well region 110). The insulating layer 130 may contain, for example, a silicon oxide, an oxide of the silicon carbide, a silicon nitride, a hafnium oxide, a zirconium oxide, an aluminum oxide, and the like or may have a stacked structure thereof.

According to one embodiment, a thickness of the insulating layer 130 may be uniformly formed in all regions. According to another embodiment, a thickness of a portion of the insulating layer 130 adjacent to a lower portion of the gate region 120 may be greater than a thickness of a portion of the insulating layer 130 formed on a sidewall of the gate region 120 to lower an electric field at the lower portion of the gate region 120. The sidewall of the gate region 120 may refer to a region of a side surface of the gate region 120 in contact with the well region.

The drift region 140 may be formed in the semiconductor layer 100 to be in contact with at least a portion of the gate region 120. The drift region 140 may include a protruding region extending toward one surface of the semiconductor layer 100. The drift region 140 may be in contact with the bottom surface of the gate region 120, and the protruding region may be in contact with side surfaces of the gate region 120 and the well region.

The drift region 140 may be a region doped in a second conductivity type. According to one embodiment, the second conductivity type may mean being doped with an N-type impurity.

The substrate region 150 may be formed beneath the drift region 140. The substrate region 150 may be doped with an impurity of the same conductivity type as that of the drift region 140. For example, when the drift region 140 is of the second conductivity type, the substrate region 150 may also be doped in the second conductivity type. In addition, the substrate region 150 may be doped with an impurity of a higher concentration than the drift region 140.

Figure 2:
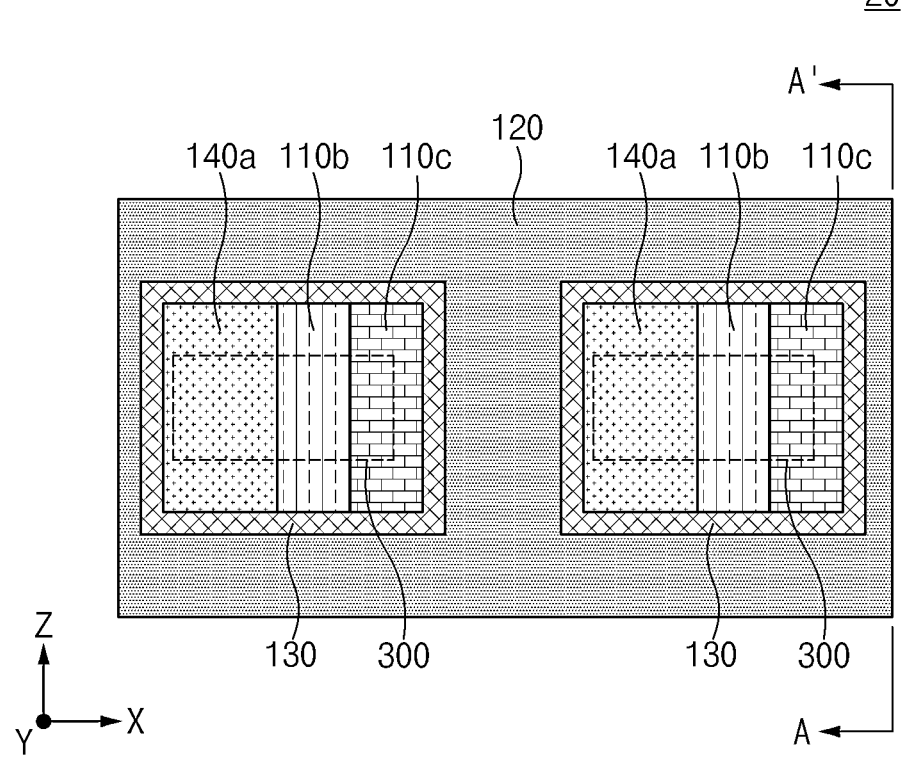
FIG. 2 shows a cross-section of a power semiconductor device according to an embodiment of the present disclosure cut along a first cutting line.

FIG. 2 shows a cross-section 20 of the power semiconductor device 10 according to an embodiment of the present disclosure cut along a first cutting line A-A'.

The cross-section 20 of the power semiconductor device 10 may have a shape viewed in a Y-axis direction (a Z-X plane).

FIG. 2 shows shapes of a contact region 110*b*, a source region 110*c*, the gate region 120, the insulating layer 130, and a protruding region 140*a*. In addition, the source electrode 300 overlapping the source region 110*c*, the gate region 120, and the protruding region 140*a* may be shown together.

The gate region 120 according to an embodiment of the present disclosure may be formed to surround the well region including the contact region 110*b* and the source region 110*c*.

According to one embodiment, the well region may have a rectangular cross-section shape. The gate region 120 may be in contact with the rectangular well region on at least three surfaces. The contact region 110*b* and the source region 110*c* may be formed at an upper portion of the well region.

As the gate region 120 is formed to be in contact with the well region on the at least three surfaces, the two or more channel regions may be formed when the semiconductor device 10 is operated.

The protruding region 140*a* may be positioned between the gate region 120 and the well region. According to one embodiment, a channel region extending from the source region 110*c* to the protruding region 140*a* may be formed.

The channel region extending from the source region 110*c* to the protruding region 140*a* may be a horizontal channel. A length of the horizontal channel may vary depending on the shape of the well region. According to one embodiment, the horizontal channel may mean a channel extending in a direction parallel to the X-axis.

As the source electrode 300 overlaps the protruding region 140*a*, a Schottky junction may be generated between the source electrode 300 and the protruding region 140*a*. The Schottky junction may refer to a junction between a metal and a semiconductor material.

A device having the Schottky junction may have rectifying characteristics because of a difference between a work function of the metal and an electron affinity of the semiconductor material.

Specifically, when the metal and the semiconductor material are bonded with each other, a rectifying barrier (a Schottky barrier) that blocks a flow of electrons or holes between the metal and the semiconductor material may be formed. A device in which the metal and the semiconductor material are bonded with each other may have a unidirectional electrical conductivity by the rectifying barrier and thus operate as a diode.

Accordingly, a Schottky barrier diode may be formed in a region in which the source electrode 300 and the protruding region 140*a* are bonded with each other.

Figure 3:
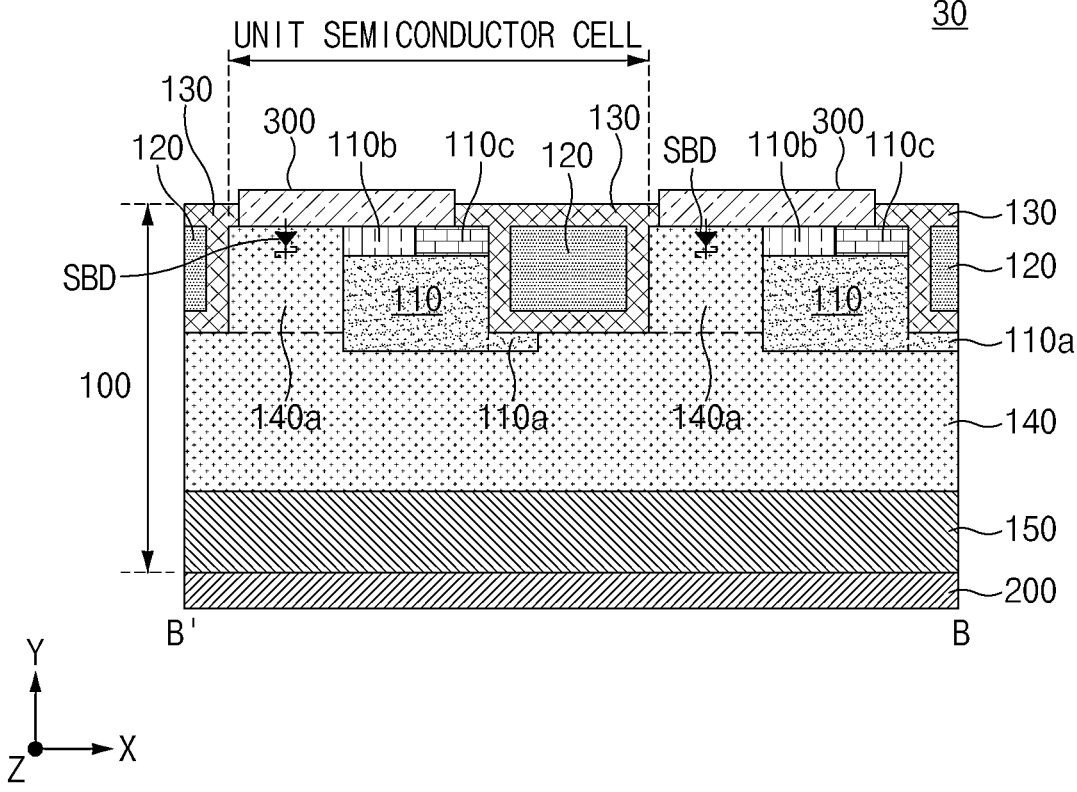
FIG. 3 shows a cross-section of a power semiconductor device according to an embodiment of the present disclosure cut along a second cutting line.

FIG. 3 shows a cross-section 30 of the power semiconductor device 10 according to an embodiment of the present disclosure cut along a second cutting line B-B'.

FIG. 3 shows a positional relationship of the semiconductor layer 100, the drain electrode 200, and the source electrode 300.

The cross-section 30 of the power semiconductor device shown in FIG. 3 may be a cross-section viewed in a Z-axis direction (a X-Y plane).

The power semiconductor device 10 may include the plurality of unit semiconductor cells, and the plurality of unit semiconductor cells may be repeatedly arranged in the direction parallel to the X-axis.

The semiconductor layer 100 may include the well region 110, the gate region 120, the insulating layer 130, the drift region 140, and the substrate region 150 as described with reference to FIG. 1.

The well region 110 may include the extended region 110a extending in a horizontal direction (the direction parallel to the X-axis) with respect to the bottom surface of the gate region 120. The well region 110 may also include the contact region 110b formed at the upper portion of the well region 110 and in contact with the source electrode 300. The well region 110 may also include the source region 110c formed at the upper portion of the well region 110 and in contact with the source electrode 300.

The extended region 110a may have the same first conductivity type as the well region 110. As the extended region 110a is formed beneath the gate region 120, when a channel is formed by the operating voltage applied to the gate region 120, an extended channel extending in the horizontal direction (the direction parallel to the X-axis) may be formed beneath the gate region 120.

The extended channel may be a channel connected to a vertical channel formed in a vertical direction (a direction parallel to a Y-axis) along the side surface of the gate region 120 from the source region 110c. As the vertical channel and the extended channel are formed, a channel density may be improved compared to a case in which only the vertical channel is formed.

The lower portion of the gate region 120 may be shielded by the extended region 110a in a conductivity type (e.g., the first conductivity type) opposite to that of the drift region 140. As the gate region 120 is shielded by the extended region 110a, a decrease in a breakdown voltage caused by the electric field concentrated at a lower end of the gate region 120 may be alleviated.

When no operating voltage is applied to the gate region 120, the electric field may be concentrated in a lower edge region of the gate region 120. The electric field may be dispersed as the extended region 110a doped in the first conductivity type is formed at the lower edge of the gate region 120 where the electric field is concentrated.

Even when the high voltage is applied to the drain electrode 200 when the semiconductor device 10 is in a non-operational state (a switch-off state), damage to the semiconductor device 10 may be prevented because of the dispersion of the electric field by the extended region 110a.

The contact region 110b may be doped in the same conductivity type as the well region 110. According to one embodiment, the contact region 110b and the well region 110 may be doped in the first conductivity type.

A doping concentration of the contact region 110b may be higher than a doping concentration of the well region 110. As the contact region 110b is doped at the higher concentration than the well region 110, a contact resistance between the source electrode 300 and the contact region 110b may be reduced.

The source region 110c may be doped in a conductivity type different from that of the well region 110. According to one embodiment, the source region 110c may be doped in the second conductivity type. The source region 110c may be doped at a higher concentration than the drift region 140.

The drift region 140 may include the protruding region 140a positioned between the well region 110 and the gate region 120. According to one embodiment, the protruding region 140a may be a region defined by the well region 110 and the gate region 120. The protruding region 140a may be a region extending from the drift region 140 in the vertical direction (the direction parallel to the Y-axis) toward one surface of the semiconductor layer 100.

When the power semiconductor device 10 operates, the operating voltage may be applied to the gate region 120. When the operating voltage is applied, the channel regions may be formed in the well region 110 adjacent to the gate region 120. Via the channel regions, electrons in the source region 110c may move to the substrate region 150 via the drift region 140. The power semiconductor device 10 may adjust an electron movement between the source electrode 300 and the drain electrode 200 by adjusting the voltage applied to the gate region 120.

The electrons may move from the source region 110c to the protruding region 140a by the channel region formed along the side surface of the well region 110. A channel region extending from the source region 110c to the protruding region 140a may be a channel constructed to allow the electrons to move in the horizontal direction (the direction parallel to the X-axis). The channel region extending from the source region 110c to the protruding region 140a may be referred to as a first channel region.

In addition, a channel region may be formed along the well region 110 and the extended region 110a respectively in contact with the side surface and the bottom surface of the gate region 120. The channel region formed along the well region 110 in contact with the side surface of the gate region 120 and the extended region 110a in contact with the bottom surface of the gate region 120 may be referred to as a second channel region.

The second channel region formed along the well region 110 in contact with the side surface of the gate region 120 and the extended region 110a from the source region 110c may include both the vertical channel in which the electrons move in the vertical direction (the direction parallel to the Y-axis) and the extended channel in which the electrons move in the horizontal direction (the direction parallel to the X-axis).

At least three channel regions may be formed as the gate region 120 and the well region 110 are in contact with each other on the at least three surfaces.

A depth at which the well region 110 is formed with respect to one surface of the semiconductor layer 100 may be referred to as the first depth. In addition, a depth at which the gate region 120 is formed with respect to one surface of the semiconductor layer 100 may be referred to as the second depth.

The well region 110 may be formed inside the semiconductor layer 100 by doping the semiconductor layer 100 with the first conductivity type impurity by the first depth. The gate region 120 may be formed in a region recessed by the second depth in the semiconductor layer 100 in which the well region 110 is formed.

According to one embodiment, the first depth may be greater than the second depth. As the well region 110 is formed deeper than the gate region 120, a portion of the well region 110 may be formed to extend in the horizontal direction along the bottom surface of the gate region 120. The portion of the well region 110 extending along the bottom surface of the gate region 120 may be referred to as the extended region 110a.

The source electrode 300 may overlap the contact region 110b, the source region 110c, and the protruding region 140a.

As the source electrode 300 extends to overlap the protruding region 140a, the Schottky barrier diode (SBD) may be formed between the source electrode 300 and the drain electrode 200 of the power semiconductor device 10.

According to one embodiment, the source electrode 300, the source region 110c, the well region 110, the gate region 120, the drift region 140, the substrate region 150, and the drain electrode 200 may operate as one power MOSFET, and the source electrode 300 and the protruding region 140a may operate as the Schottky barrier diode (SBD) having the metal-silicon junction.

The power MOSFET and the Schottky barrier diode (SBD) may be electrically connected to each other and may control the flow of the charges flowing in the power semiconductor device 10 based on the voltage applied to the source electrode 300 and the drain electrode 200.

An operation method of the power semiconductor device including the Schottky barrier diode (SBD) may be specifically as follows.

When the power semiconductor device 10 is driven, the operating voltage may be applied to the gate region 120. When the operating voltage is applied to the gate region 120, the first channel region extending from the source region 110c to the protruding region 140a may be formed, and the second channel region extending from the source region 110c to the side surface of the gate region 120 may be formed along the extended region 110a in contact with the bottom surface of the gate region 120.

When the voltage is applied to the source electrode 300 and the drain electrode 200, the charges may move via the first channel region and the second channel region. According to one embodiment, when the drift region 140 is doped with the impurity having the second conductivity type (e.g., the N-type impurity), a relatively low voltage may be applied to the source electrode 300 and a higher voltage may be applied to the drain electrode 200.

As the channel regions are formed, the charges may move from the source region 110c to the protruding region 140a and the drift region 140. In this regard, when the drift region 140 is doped with the impurity having the second conductivity type (e.g., the N-type impurity), a carrier for moving the charge may be the electron.

When the electrons move from the source region 110c to the protruding region 140a and the drift region 140, a current may flow from the drain electrode 200 to the source electrode 300. The current flowing at this time may be referred to as a MOSFET forward current. In addition, when the MOSFET forward current flows, a voltage applied to the source electrode 300 and the drain electrode 200 may be referred to as a MOSFET forward bias voltage.

When the MOSFET forward bias voltage is applied, no current or a very small amount of current may flow to the Schottky barrier diode (SBD).

While the power semiconductor device 10 in which the drift region 140 is doped with the impurity having the second conductivity type (e.g., the N-type impurity) is operating, a relatively high voltage may be applied to the source electrode 300 and a relatively low voltage may be applied to the drain electrode 200. In this regard, the voltage applied to the source electrode 300 and the drain electrode 200 may be referred to as a MOSFET reverse bias voltage.

When the Schottky barrier diode (SBD) is not formed, a current may flow via a diode formed by a PN junction (e.g., a junction between the well region 110 and the drift region 140) inside the power MOSFET by the MOSFET reverse bias voltage. When the current flows via the PN junction diode, degradation of the power semiconductor device 10 may occur and device reliability may be deteriorated.

When the Schottky barrier diode (SBD) is formed, when the MOSFET reverse bias voltage is applied, the current may be induced toward the Schottky barrier diode (SBD).

In other words, when the relatively high voltage is applied to the source electrode 300 and the lower voltage is applied to the drain electrode 200, the current flow on a side of the Schottky barrier diode (SBD) becomes smoother than that on a side of the power MOSFET, so that the current flows to the side of the Schottky barrier diode (SBD) other than to the side of the power MOSFET, which prevents the degradation of the power semiconductor device 10.

According to one embodiment, when the relatively high voltage is applied to the source electrode 300 and the lower voltage is applied to the drain electrode 200, the voltage applied to the source electrode 300 and the drain electrode 200 may be referred to as a Schottky diode forward voltage.

In other words, the Schottky diode forward voltage may be the MOSFET reverse bias voltage.

The power semiconductor device 10 according to an embodiment of the present disclosure may allow the source electrode 300 and the protruding region 140a to overlap each other so as to form the Schottky barrier diode (SBD). Thus, deterioration of characteristics of the power semiconductor device 10 may be prevented by the MOSFET reverse bias voltage without increasing a size of the power semiconductor device 10.

In addition, in the case of the Schottky barrier diode (SBD), a reverse recovery time for a voltage change (a time it takes to change a current flow when a direction of the voltage applied to the diode is changed) is short, and thus switching characteristics of the power semiconductor device 10 may be improved.

In addition, the Schottky barrier diode (SBD) may have a lower voltage drop value than the PN junction diode when the same voltage is applied.

Accordingly, the power semiconductor device 10 according to an embodiment of the present disclosure may include the Schottky barrier diode (SBD), so that power consumption may be reduced compared to a device not including the Schottky barrier diode (SBD).

Figure 4A:
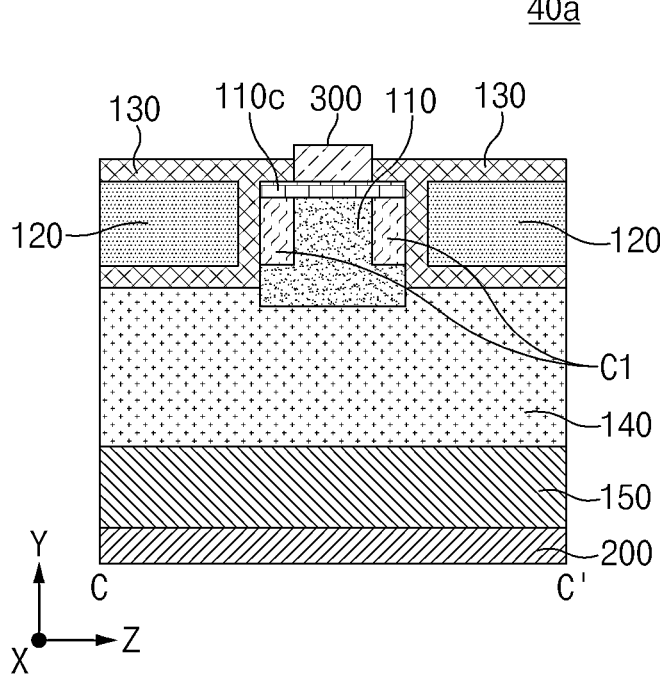
FIG. 4A shows a cross-section of a power semiconductor device according to an embodiment of the present disclosure cut along a third cutting line.

FIG. 4A shows a cross-section 40a of the power semiconductor device 10 according to an embodiment of the present disclosure cut along a third cutting line C-C'.

Figure 4B:
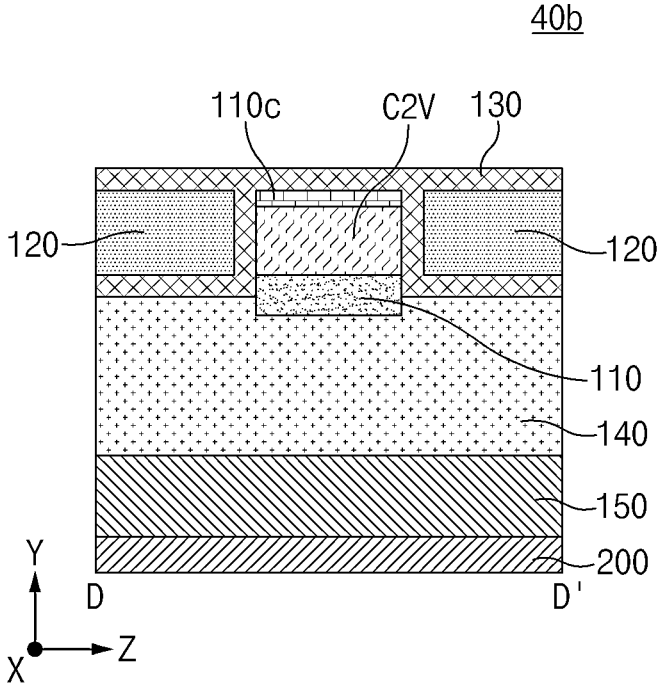
FIG. 4B shows a cross-section of a power semiconductor device according to an embodiment of the present disclosure cut along a fourth cutting line.

FIG. 4B shows a cross-section 40b of the power semiconductor device 10 according to an embodiment of the present disclosure cut along a fourth cutting line D-D'.

Figure 4C:
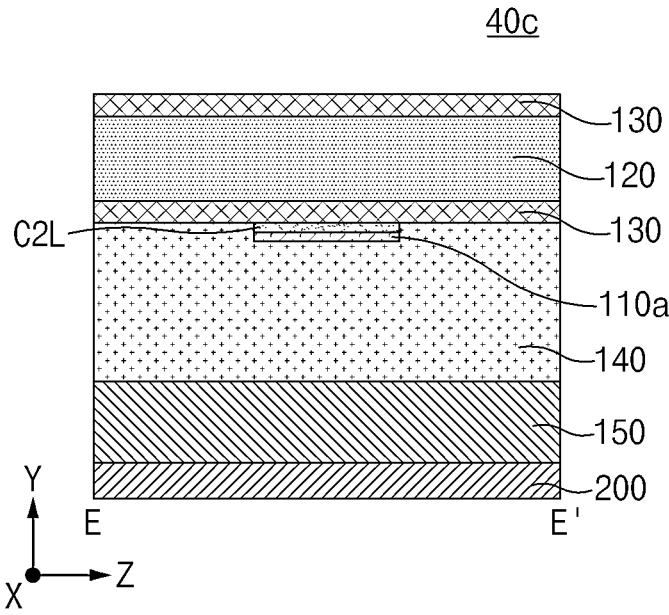
FIG. 4C shows a cross-section of a power semiconductor device according to an embodiment of the present disclosure cut along a fifth cutting line.

FIG. 4C shows a cross-section 40c of the power semiconductor device 10 according to an embodiment of the present disclosure cut along a fifth cutting line E-E'.

Figure 4D:
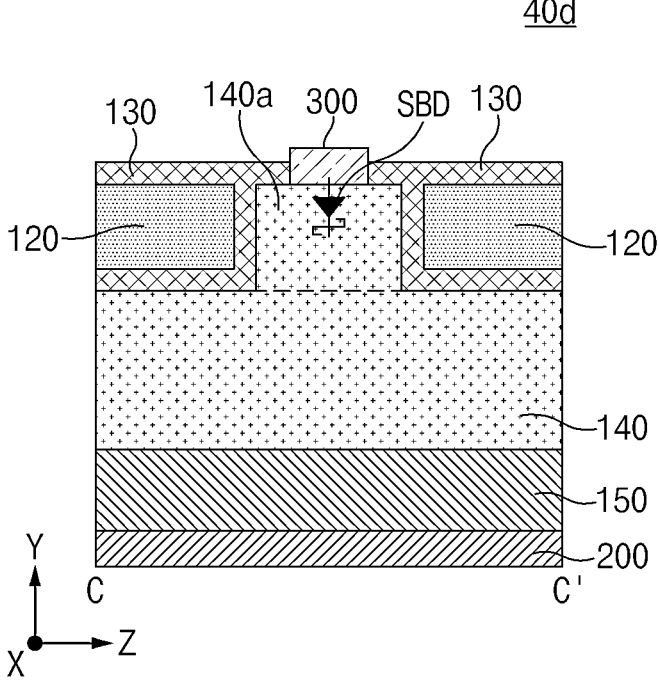
FIG. 4D shows a cross-section of a power semiconductor device according to an embodiment of the present disclosure cut along a sixth cutting line.

FIG. 4D shows a cross-section 40d of the power semiconductor device 10 according to an embodiment of the present disclosure cut along a sixth cutting line F-F'.

Hereinafter, the channel regions formed in the power semiconductor device 10 when the operating voltage is applied to the gate region 120 are described in detail with reference to FIGS. 4A, 4B, and 4C.

In addition, the Schottky barrier diode (SBD) formed between the source electrode 300 and the protruding region 140a will be described in detail with reference to FIG. 4D.

A cross-section of a first channel region C1 formed in the horizontal direction (the direction parallel to the X-axis) along the side surface of the well region 110 is shown in FIG. 4A. The first channel region C1 may include a horizontal channel (a channel extending in the direction parallel to the X-axis) formed between the source region 110c and the protruding region 140a.

A length in the X-axis direction of the first channel region C1 may be determined based on the shape of the well region 110. In addition, a length in the Y-axis direction of the first channel region C1 may be determined based on the depth (the second depth) at which the gate region 120 is formed.

A vertical channel C2V of the second channel region formed along another side surface of the well region 110 is shown in FIG. 4B. The vertical channel C2V of the second channel region may be formed between a bottom surface of the well region 110 and the source region 110c. The vertical channel C2V of the second channel region may be formed to extend along the side surface of the gate region 120.

According to one embodiment, a length in the vertical direction (the direction parallel to the Y-axis) of the vertical channel C2V included in the second channel region may be determined based on a length in the vertical direction (the direction parallel to the Y-axis) of the gate region 120.

A cross-section of an extended channel C2L included in the second channel region is shown in FIG. 4C.

The extended channel C2L of the second channel region may be a channel extending in the horizontal direction (the direction parallel to the X-axis) along the bottom surface of the gate region 120.

According to one embodiment, a length in the horizontal direction (the direction parallel to the X-axis) of the extended channel C2L included in the second channel region may be determined based on a length in the horizontal direction (the direction parallel to the X-axis) of the extended region 110a.

In the power semiconductor device 10 according to an embodiment of the present disclosure, the gate region 120 is in contact with the well region on the at least three surfaces, and the first channel region C1 and the second channel regions C2V and C2L are formed in the region where the gate region 120 and the well region are in contact with each other, so that the electron movement may be facilitated when the operating voltage is applied to the gate region 120.

In particular, the power semiconductor device 10 of the present disclosure further includes the first channel region C1 compared to a trench-type gate structure including only the vertical channel, so that the electrons may be dispersed to the first channel region C1, and thus resistances of the entire channel regions may be reduced.

In addition, the extended channel C2L included in the second channel region may operate as a channel through which the electrons move to facilitate the movement of the electrons when a driving voltage is applied to the gate region 120. The extended channel C2L may disperse the electric field focused at the lower end of the gate region 120 to increase the breakdown voltage of the power semiconductor device 10 when the driving voltage is not applied.

A cross-section of the Schottky barrier diode (SBD) formed as the source electrode 300 and the protruding region 140a are in contact with each other is shown in FIG. 4D.

According to one embodiment, characteristics of the Schottky barrier diode may be determined based on a type of the metal included in the source electrode 300. In addition, the characteristics of the Schottky barrier diode may be determined based on a doping concentration of the protruding region 140a, the conductivity type of the impurity doped in the protruding region 140a, and the like.

Figure 5:
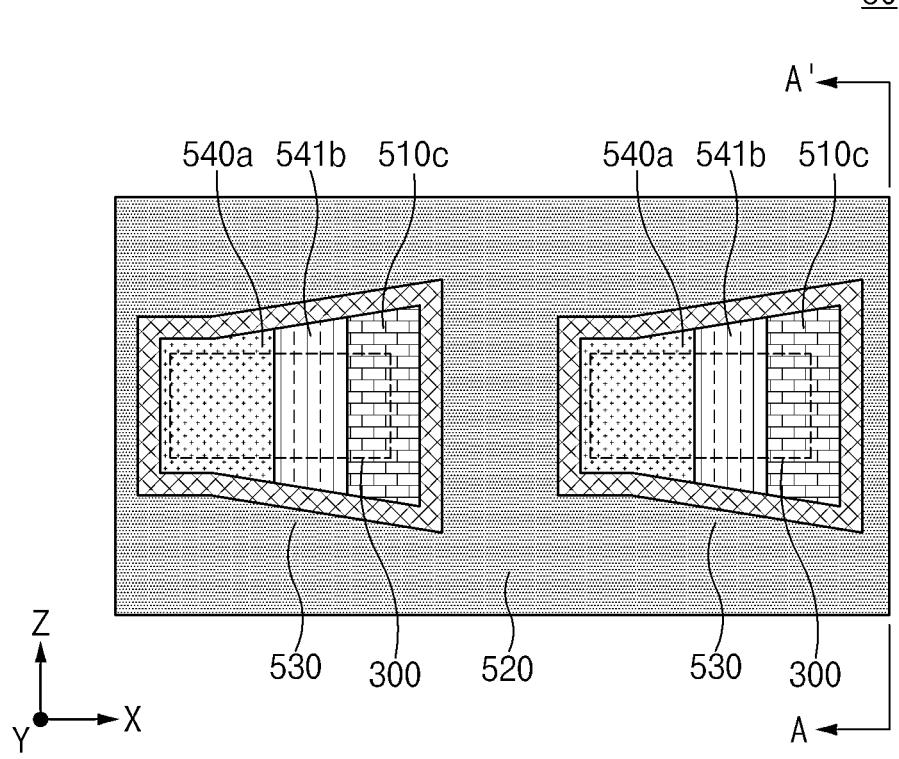
FIG. 5 shows a cross-section of a power semiconductor device according to another embodiment of the present disclosure cut along a first cutting line.

FIG. 5 shows a cross-section 50 of a power semiconductor device according to another embodiment of the present disclosure cut along the first cutting line A-A'.

The cross-section 50 of the power semiconductor device according to another embodiment of the present disclosure may have a shape viewed in the Y-axis direction (the Z-X plane).

An arrangement shape of a contact region 510b, a source region 510c, a gate region 520, an insulating layer 530, a protruding region 540a, and the source electrode 300 is shown in FIG. 5.

The gate region 520 according to another embodiment of the present disclosure may be formed to surround a well region.

According to another embodiment, the well region may have a trapezoidal cross-section shape. The gate region 520 may be in contact with the trapezoidal well region on at least three planes.

According to another embodiment, shapes of the contact region 510b and the source region 510c may be determined based on the shape of the well region.

As the gate region 520 is formed to be in contact with the well region on the at least three surfaces, two or more channel regions may be formed when the semiconductor device 10 is operated.

The protruding region 540a may be positioned between the gate region 520 and the well region. According to one embodiment, a channel region may be formed between the protruding region 540a and the source region 510c.

The channel region formed between the protruding region 540a and the source region 510c may be a first channel region. A length of the first channel region may vary depending on the shape of the well region.

According to another embodiment of the present disclosure, when lengths in the horizontal direction (the direction parallel to the X-axis) of the well regions are the same, the length of the first channel region formed in the trapezoidal well region may be greater than the length of the first channel region formed in the rectangular well region (e.g., the well region in FIG. 2). By adjusting the length of the first channel region, the charge movement between the source electrode and the drain electrode may be adjusted and a current density inside the power semiconductor device 10 may be adjusted.

In addition, the source electrode 300 may be formed to overlap the protruding region 540a, the contact region 510b, and the source region 510c, and the Schottky barrier diode may be formed by the source electrode 300 in contact with the protruding region 540a.

Figure 6:
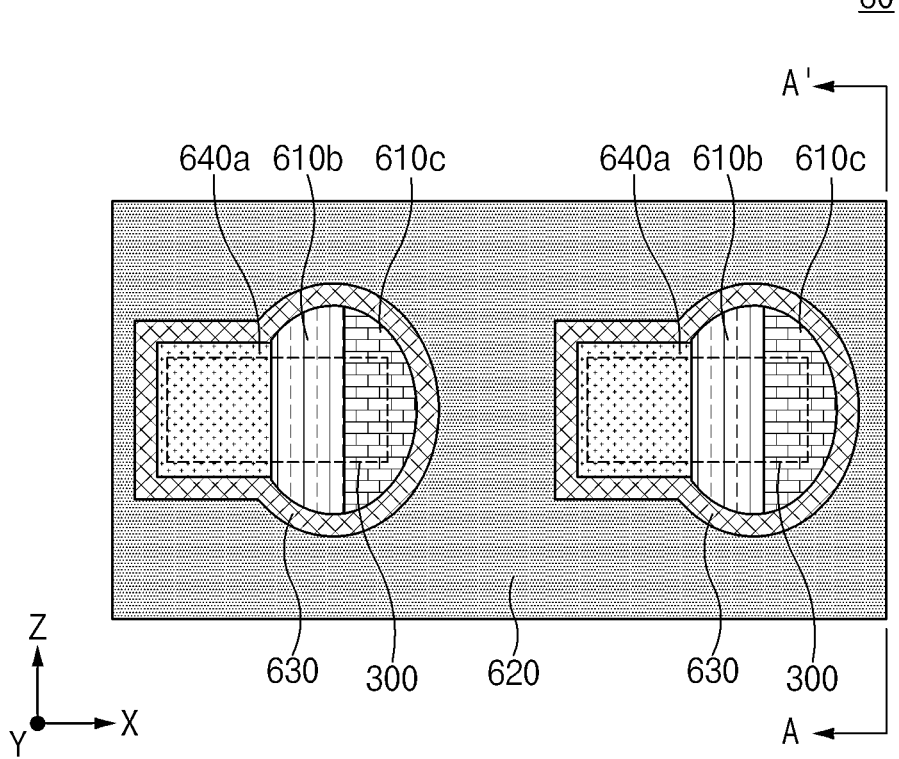
FIG. 6 shows a cross-section of a power semiconductor device according to another embodiment of the present disclosure cut along a first cutting line.

FIG. 6 shows a cross-section 60 of a power semiconductor device according to another embodiment of the present disclosure cut along the first cutting line A-A'.

A gate region 620 according to another embodiment of the present disclosure may be formed to surround a well region including a contact region 610b and a source region 610c.

According to another embodiment, the well region may have a circular cross-section shape. The gate region 620 may be formed to surround the circular well region.

Shapes of the contact region 610b and the source region 610c may be determined based on the shape of the well region.

According to one embodiment, a channel region may be formed between a protruding region 640a and the source region 610c.

According to another embodiment of the present disclosure, when lengths in the horizontal direction (the direction parallel to the X-axis) of the well regions are the same, a length of a first channel region formed on a side surface of the circular well region may be greater than a length of the first channel region formed in the rectangular well region (e.g., the well region in FIG. 2).

When the length of the first channel region is great, a channel resistance may be greater than that in the case in which the length of the first channel region is small. When a resistance of the first channel region increases, electrons moving to the first channel region may decrease and electrons moving to the second channel region may increase.

The power semiconductor device according to an embodiment of the present disclosure may control an amount of electrons moving to the first channel region or the second channel region by adjusting the length of the first channel region based on the cross-section shape of the well region.

In addition, the source electrode 300 may be formed to overlap the protruding region 640a, the contact region 610b, and the source region 610c, and the Schottky barrier diode may be formed by the source electrode 300 in contact with the protruding region 640a.

FIGS. 7A-7F show a method for fabricating a power semiconductor device according to an embodiment of the present disclosure.

Figure 7A:
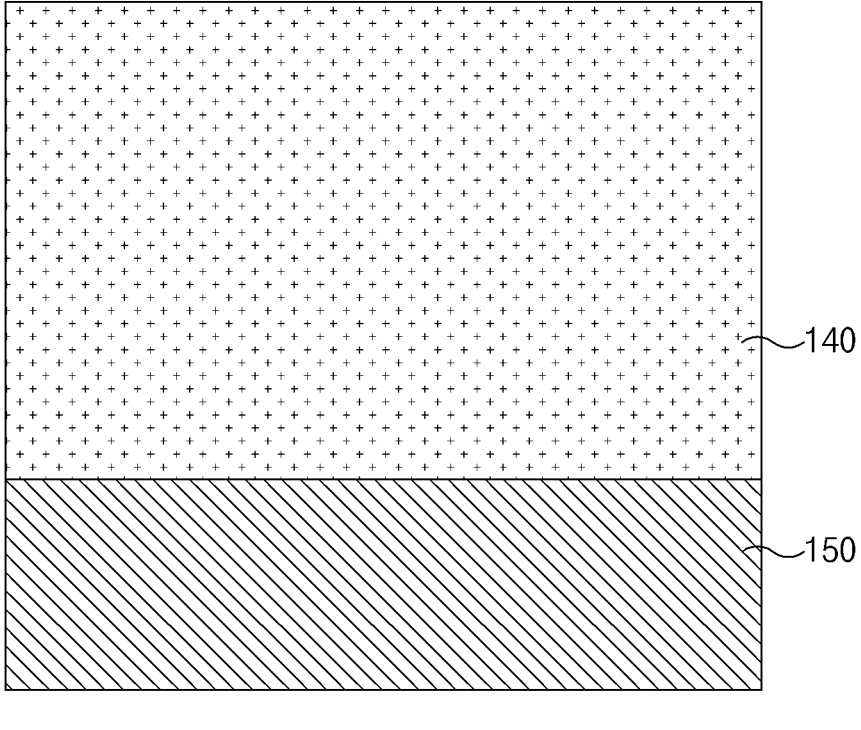
FIGS. 7A-7F show a method for fabricating a power semiconductor device according to an embodiment of the present disclosure.

According to FIG. 7A, the drift region 140 may be formed on top of the substrate region 150. The substrate region 150 may include the silicon carbide substrate doped with the impurity having the second conductivity type.

The drift region 140 may be the epitaxial layer as an example. The drift region 140 may be doped with the impurity having the second conductivity type and may be doped at a higher concentration than the substrate region 150.

Figure 7B:
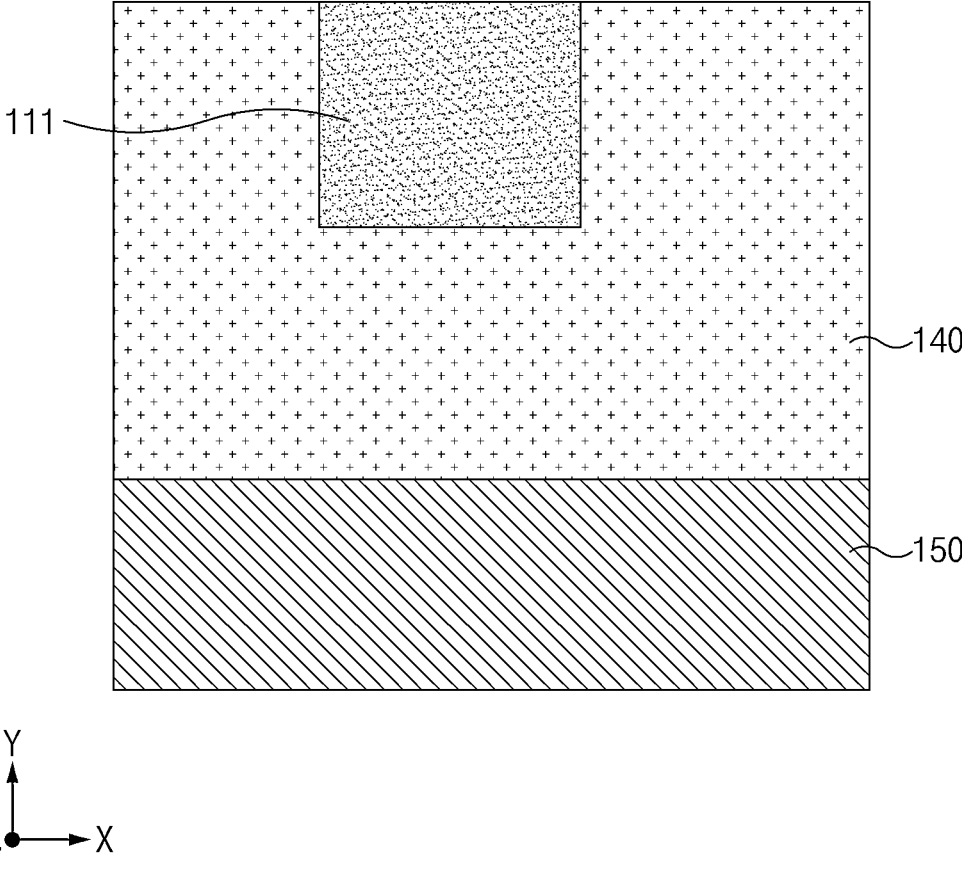

A process of forming a well doped region 111 doped with the impurity having the first conductivity type in the drift region 140 is shown in FIG. 7B. The depth at which the well region 110 is formed may be determined based on a depth at which the well doped region 111 is formed.

In addition, the length of the first channel region formed along the side surface of the well region 110 may be determined based on a length in the X-axis direction in which the well doped region 111 is formed.

The well doped region 111 may be formed by, for example, an ion implantation process.

Figure 7C:
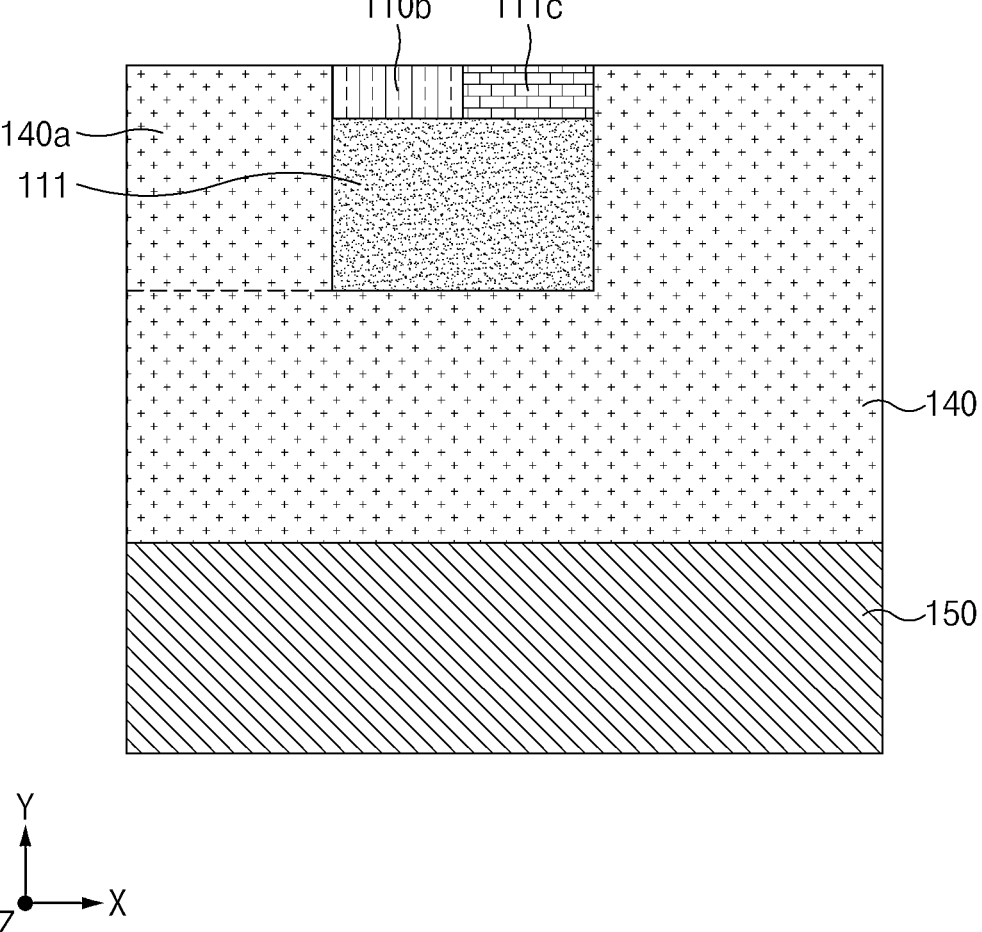

A process of forming the contact region 110b and a source doped region 111c at an upper portion of the well doped region 111 is shown in FIG. 7C. The contact region 110b may be doped with an impurity having the same conductivity type as that of the well doped region 111. The contact region 110b may be doped at a higher concentration than the well doped region 111.

The source doped region 111c may be doped with an impurity having a conductivity type different from that of the well doped region 111.

Each of the contact region 110b and the source doped region 111c may be formed via the ion implantation process.

A region in contact with a side surface of the well doped region 111 and protruding from the drift region 140 may be referred to as the protruding region 140a.

Figure 7D:
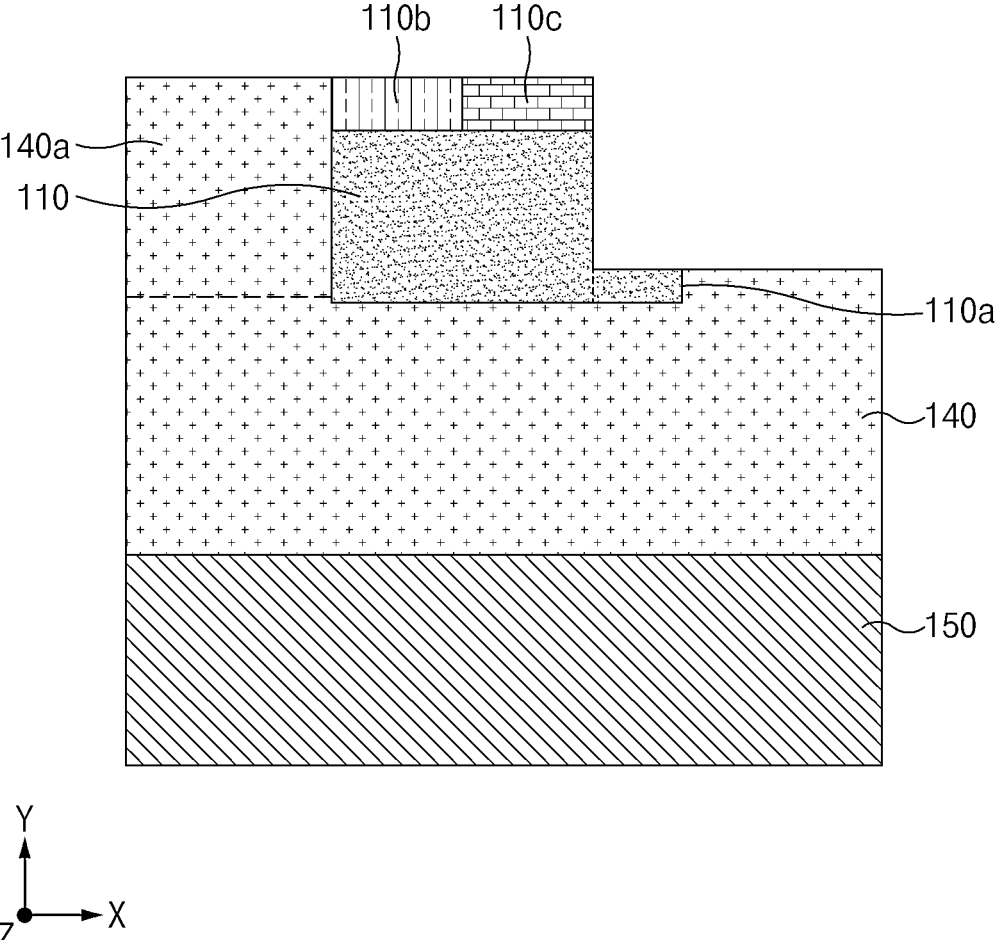
Figure 7E:
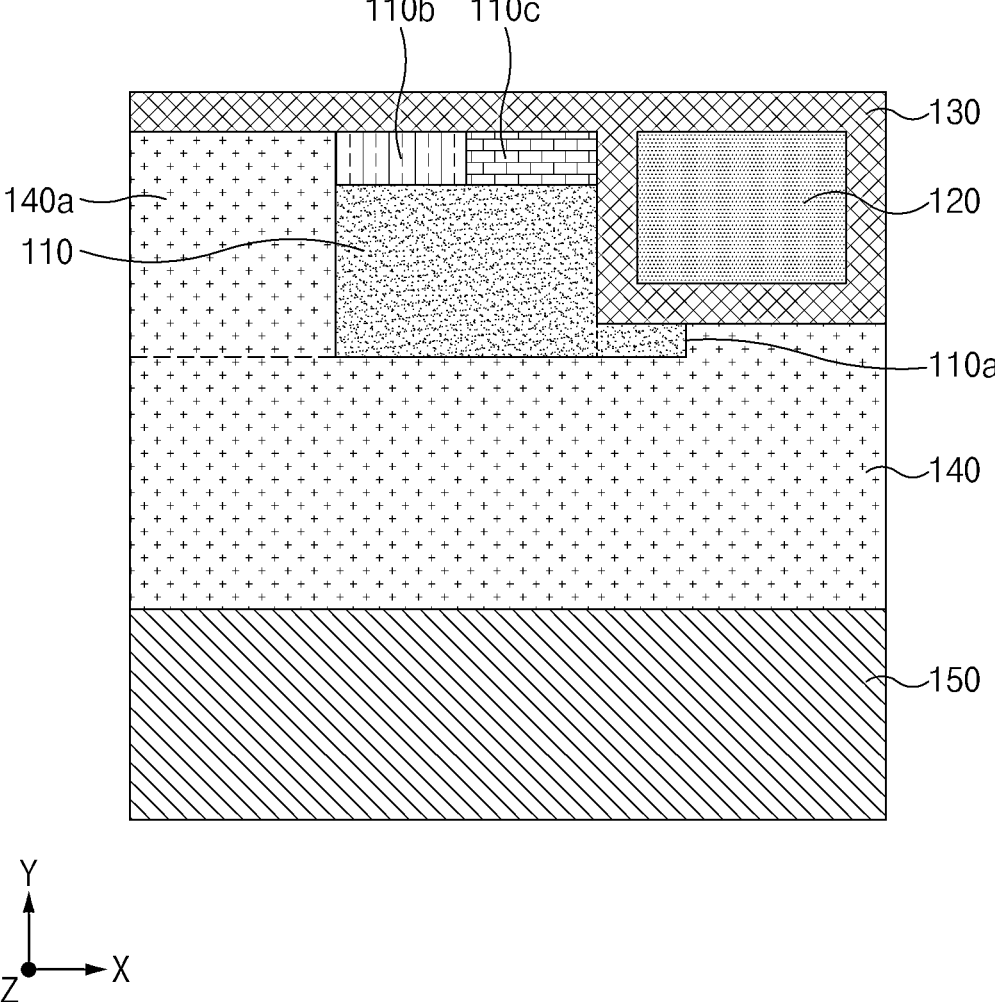

A process of etching a portion of each of the drift region 140, the well doped region 111, and the source doped region 111c, and forming the insulating layer 130 and the gate region 120 is shown in FIGS. 7D and 7E.

The drift region 140, the well doped region 111, and the source doped region 111c may be etched via the etching process. The depth at which the gate region 120 is formed may be determined based on a depth at which the drift region 140, the well doped region 111, and the source doped region 111c are etched.

After the etching process, the insulating layer 130 and the gate region 120 may be formed via a deposition process. The insulating layer 130 may include, for example, a silicon oxide film.

The protruding region 140a may be a region that is not etched via the etching process.

Figure 7F:
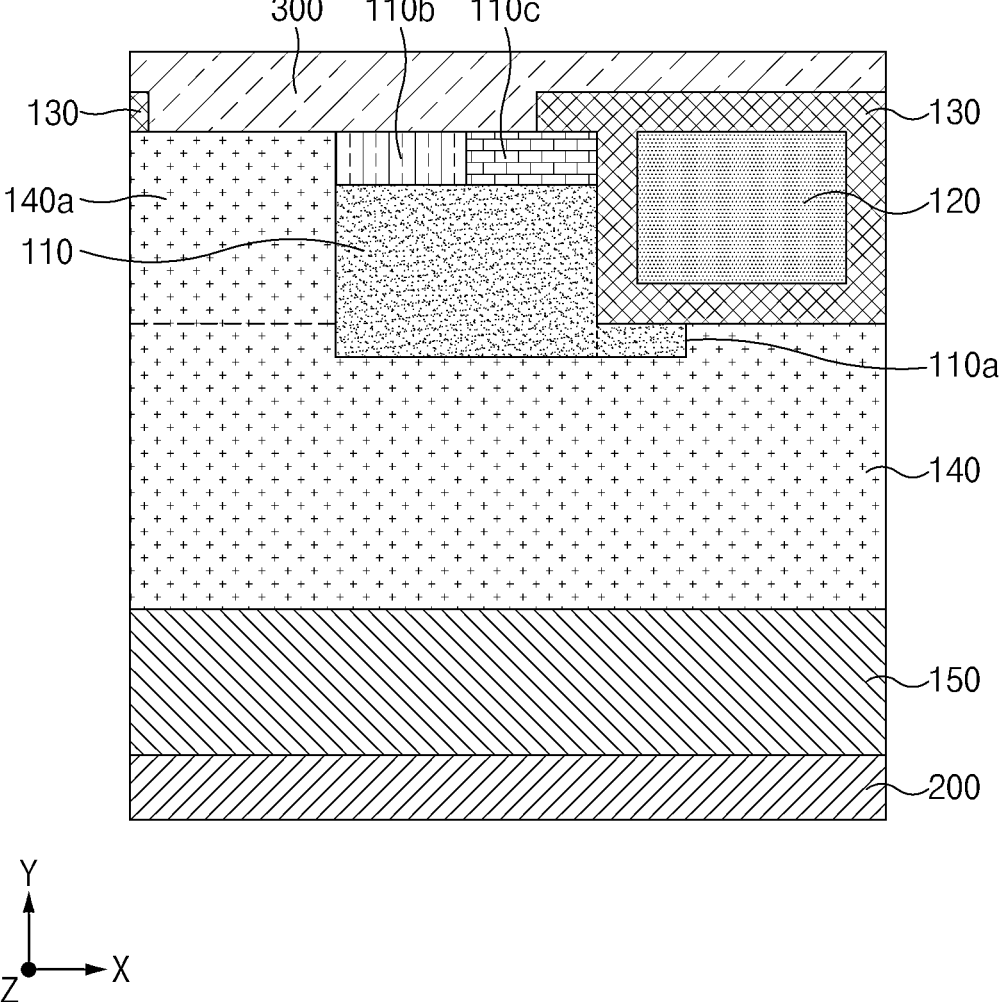

A process of forming the source electrode 300 and the drain electrode 200 is shown in FIG. 7F.

The source electrode 300 and the drain electrode 200 may contain a conductive material such as the metal or the silicon, and the source electrode 300 and the drain electrode 200 may be formed via the deposition process.

When forming the source electrode 300, a portion of the insulating layer 130 may be removed based on the etching process or the like, and the portion of the insulating layer 130 may be removed so as to be in contact with the source region 110c, the contact region 110b, and the protruding region 140a.

Hereinabove, although the embodiments of the present disclosure have been described with reference to the accompanying drawings, those of ordinary skill in the art to which the present disclosure belongs should understand that the present disclosure may be embodied in other specific forms without changing the technical spirit or essential features thereof. Therefore, it should be understood that the embodiments described above are illustrative in all respects and not restrictive.

According to the power semiconductor device and the method for fabricating the same according to an embodiment of the present disclosure, the breakdown voltage of the power semiconductor device may be increased while alleviating the concentration of the electric field at the lower portion of the gate region.

In addition, the density of channels formed in the power semiconductor device may be increased to increase a degree of integration and reduce the power loss.

In addition, a power semiconductor device forming the Schottky barrier diode in the power semiconductor to reduce the power loss and reduce a device size may be provided.

In addition, various effects directly or indirectly identified through this document may be provided.

Hereinabove, although the present disclosure has been described with reference to embodiments and the accompanying drawings, the present disclosure is not limited thereto. The present disclosure may be variously modified and altered by those having ordinary skill in the art to which the present disclosure pertains without departing from the spirit and scope of the present disclosure claimed in the following claims.

What is claimed is:

1. A power semiconductor device comprising:
a semiconductor layer;
a well region located inside the semiconductor layer and having a first conductivity type;
a source region located on the well region and having a second conductivity type;
a gate region in contact with a side surface of the well region and surrounding the well region;
a drift region in contact with bottom surfaces of the well region and the gate region and having the second conductivity type;
a contact region located on the well region and having the first conductivity type; and
a first channel region and a second channel region located in a region where the gate region and the well region are in contact with each other, wherein the drift region includes a protruding region in contact with another side surface of the well region, wherein the power semiconductor device includes a source electrode in contact with each of the source region, the contact region, and the protruding region, wherein the first channel region includes a horizontal channel extending from the source region toward the protruding region, and wherein the second channel region includes a vertical channel extending from the source region along a side surface of the gate region.

2. The power semiconductor device of claim 1, wherein a Schottky barrier diode is formed between the source electrode and the protruding region.

3. The power semiconductor device of claim 1, wherein a doping concentration of the source region is higher than a doping concentration of the drift region.

4. The power semiconductor device of claim 1, wherein a doping concentration of the contact region is higher than a doping concentration of the well region.

5. The power semiconductor device of claim 1, further comprising:

a substrate region located beneath the drift region and having the second conductivity type; and a drain electrode located beneath the substrate region and in contact with the substrate region, wherein a doping concentration of the substrate region is higher than a doping concentration of the drift region.

6. A power semiconductor device comprising:

a semiconductor layer;

a well region located inside the semiconductor layer and having a first conductivity type;

a source region located on the well region and having a second conductivity type;

a gate region in contact with a side surface of the well region and surrounding the well region;

a drift region in contact with bottom surfaces of the well region and the gate region and having the second conductivity type; and a contact region located on the well region and having the first conductivity type, wherein the drift region includes a protruding region in contact with another side surface of the well region, wherein the power semiconductor device includes a source electrode in contact with each of the source region, the contact region, and the protruding region, and wherein the gate region is in contact with the well region on at least three surfaces.

7. A power semiconductor device comprising:

a semiconductor layer;

a well region located inside the semiconductor layer and having a first conductivity type;

a source region located on the well region and having a second conductivity type;

a gate region in contact with a side surface of the well region and surrounding the well region;

a drift region in contact with bottom surfaces of the well region and the gate region and having the second conductivity type; and a contact region located on the well region and having the first conductivity type, wherein the drift region includes a protruding region in contact with another side surface of the well region, wherein the power semiconductor device includes a source electrode in contact with each of the source region, the contact region, and the protruding region, wherein the well region is located at a first depth from one surface of the semiconductor layer, wherein the gate region is located at a second depth from the one surface of the semiconductor layer, wherein the first depth is greater than the second depth, and wherein the well region includes an extended region extending along the bottom surface of the gate region.

8. The power semiconductor device of claim 7, further comprising:

a channel region located in a region where the gate region and the well region are in contact with each other, wherein the channel region includes a vertical channel extending from the source region along a side surface of the gate region and an extended channel positioned on the extended region and extending along the bottom surface of the gate region.

* * * * *